(12) United States Patent
Khoury et al.

(10) Patent No.: US 6,343,940 B1
(45) Date of Patent: Feb. 5, 2002

(54) CONTACT STRUCTURE AND ASSEMBLY MECHANISM THEREOF

(75) Inventors: Theodore A. Khoury, Evanston; Robert Edward Aldaz, Carol Stream; Yu Zhou, Libertyville, all of IL (US)

(73) Assignee: Advantest Corp, Tokyo (JP)

( * ) Notice: Subject to any disclaimer, the term of this patent is extended or adjusted under 35 U.S.C. 154(b) by 0 days.

(21) Appl. No.: 09/596,437

(22) Filed: Jun. 19, 2000

(51) Int. Cl.[7] .................................................. H01R 9/09
(52) U.S. Cl. ........................................................ 439/66
(58) Field of Search .............................. 439/66, 591, 69, 439/594, 21; 29/843

(56) References Cited

U.S. PATENT DOCUMENTS

| | | | | |
|---|---|---|---|---|
| 4,236,776 A | * | 12/1980 | Wellington | 339/17 R |
| 4,806,104 A | * | 2/1989 | Cabourne | 439/66 |
| 5,675,183 A | * | 10/1997 | Swamy et al. | 257/723 |
| 5,952,843 A | * | 9/1999 | Vinh | 324/761 |
| 6,156,221 A | * | 12/2000 | Lauffer et al. | 216/105 |

* cited by examiner

Primary Examiner—Gary Paumen
Assistant Examiner—Phuongchi Nguyen
(74) Attorney, Agent, or Firm—Muramatsu & Associates

(57) ABSTRACT

A contact structure having a contact substrate and a plurality of contactors is a block of a large contact structure or a contactor assembly for establishing electrical connection with contact targets. The contact structure is formed of a contact substrate and a plurality of contactors in which each of the contactors has a curved portion for exerting a spring force in a vertical direction. The contact substrate has engagement mechanism at outer edges thereof so as to connect other contact substrates at any desired edges to establish the contactor assembly with desired size, shape and number of contactors.

26 Claims, 8 Drawing Sheets

Fig. 1
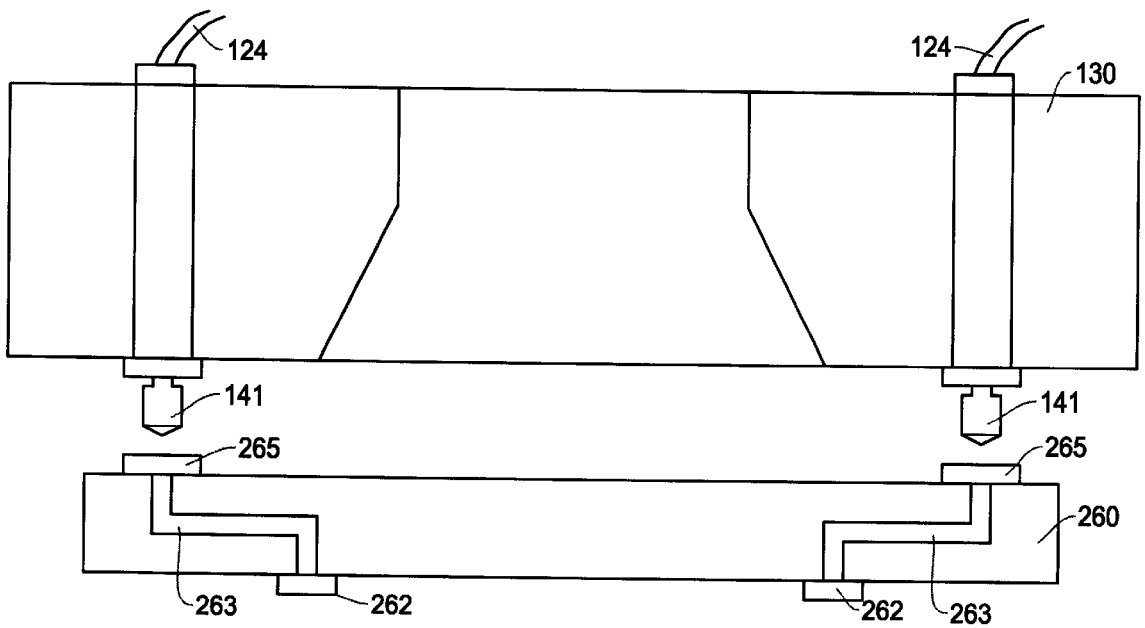
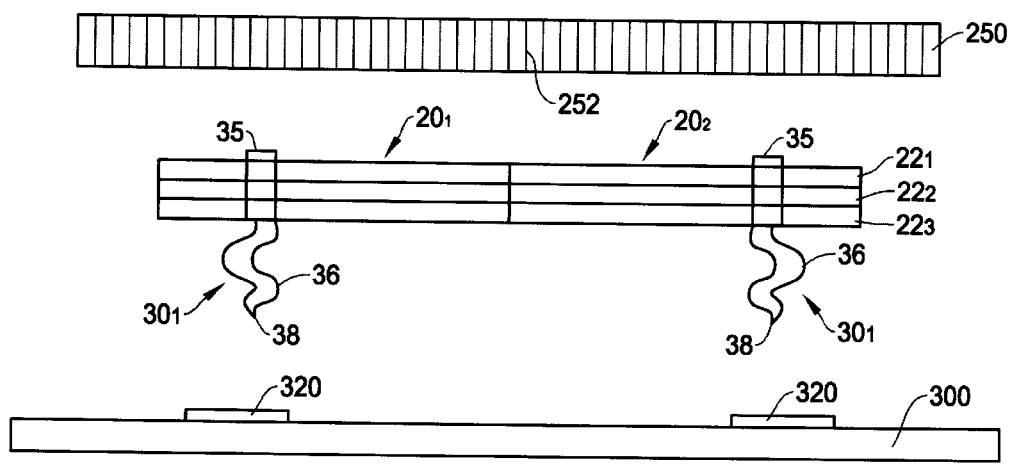

Fig. 2
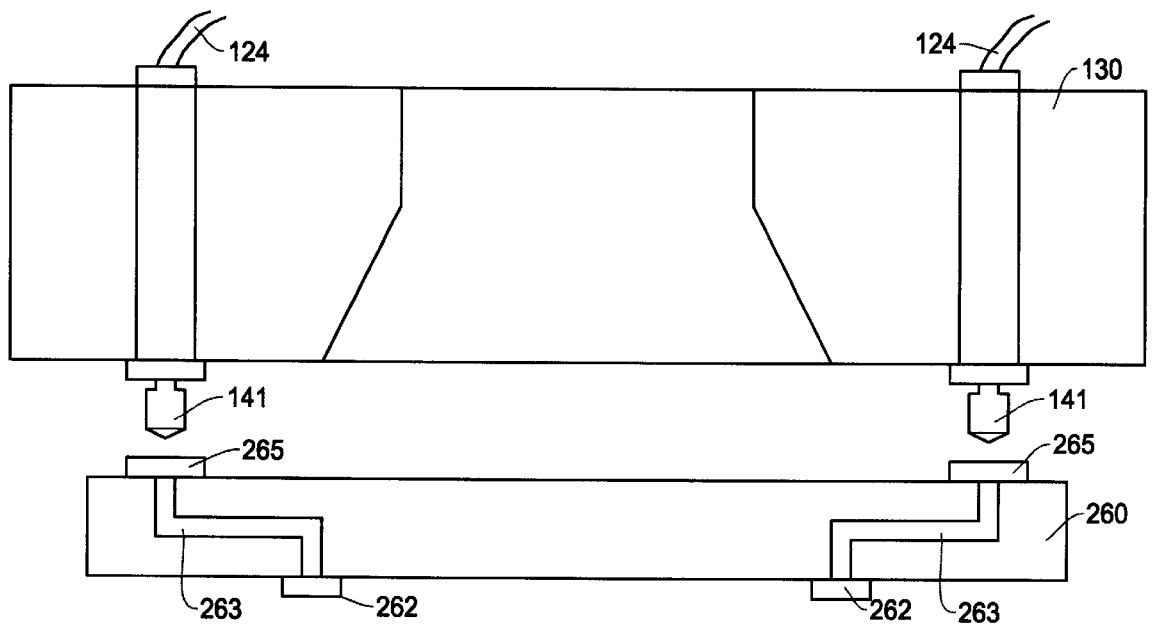
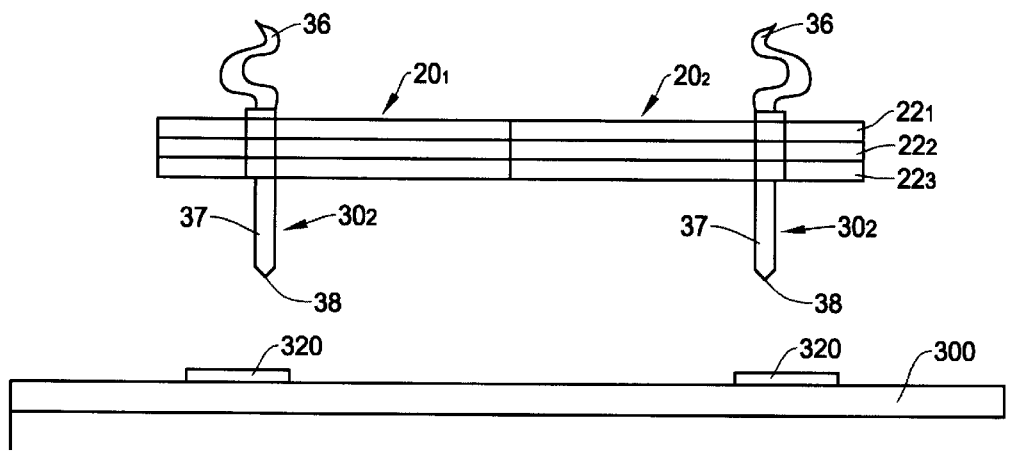

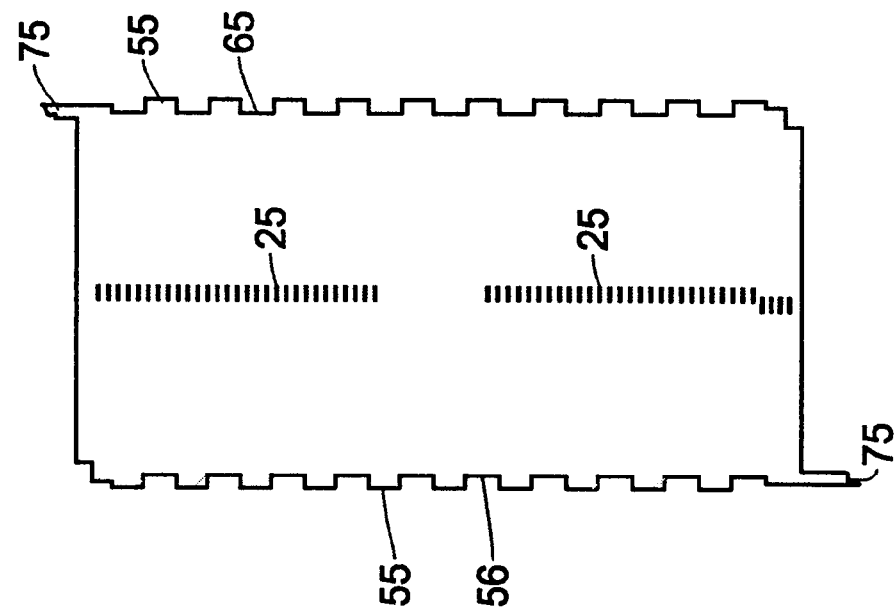
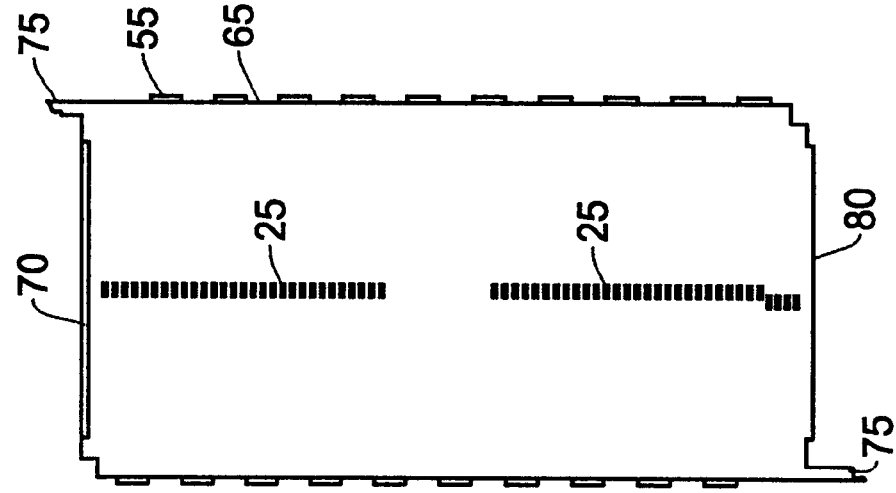
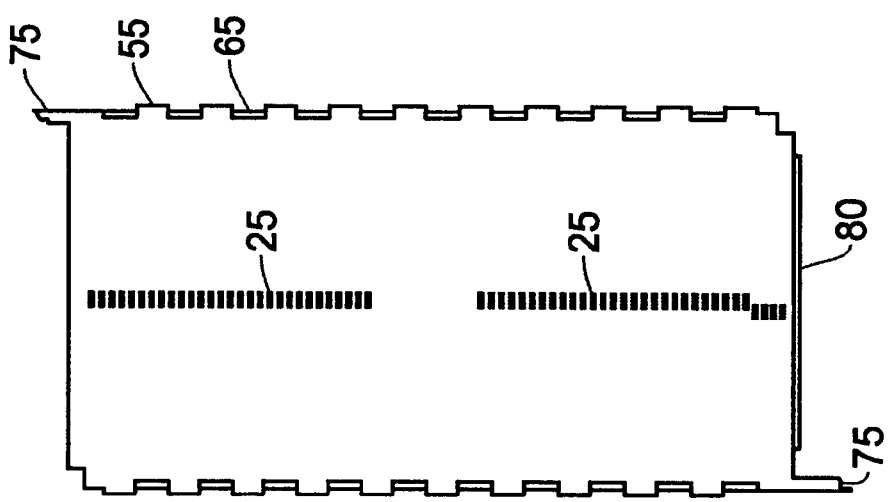

CONTACT STRUCTURE AND ASSEMBLY MECHANISM THEREOF

FIELD OF THE INVENTION

This invention relates to a contact structure having a large number of contactors in a vertical direction for establishing electrical connections with contact targets, and more particularly, to a contact structure and its assembly mechanism for assembling a plurality of contact structures to form a contactor assembly of desired size, shape and number of contactors.

BACKGROUND OF THE INVENTION

In testing high density and high speed electrical devices such as semiconductor wafers, LSI and VLSI circuits, a high performance contact structure such as a probe card having a large number of contactors must be used. The present invention is mainly directed to a contact structure and assembly of plural contact structures to be used in testing LSI and VLSI chips, semiconductor wafers, burn-in of semiconductor wafers and die, testing and burn-in of packaged semiconductor devices, printed circuit boards and the like. However, the present invention is not limited to the test applications noted above but can be used for any applications involving electrical connections such as forming leads or terminal pins of IC chips, IC packages or other electronic circuits and devices. Thus, in the following, the present invention is described with respect to the semiconductor device testing only for the simplicity of explanation.

In the case where semiconductor devices to be tested are in the form of a semiconductor wafer, a semiconductor test system, such as an IC tester is usually connected to a substrate handler, such as an automatic wafer prober, to automatically test the semiconductor wafer. The semiconductor wafers to be tested are automatically provided to a test position of a test head of the semiconductor test system by the substrate handler.

On the test head, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

The test head and the substrate handler are connected through an interface component which includes a probe card or contactor assembly. A probe card has a large number of probe contactors (such as cantilevers or needles) to contact with contact targets such as circuit terminals or contact pads in the IC circuit on the semiconductor wafer under test. The probe contactors contact the contact targets of the semiconductor wafer to apply test signals to the semiconductor wafer and receive the resultant output signals from the wafer.

An example of such a probe card has an epoxy ring on which a plurality of probe contactors called needles or cantilevers are mounted. Because of signal path length of the components used in the conventional probe contactors is in the range of 20–30 mm without impedance matching, high speed operation or frequency bandwidth of the probe card is limited to the order of 200–300 MHz. In the semiconductor test industry, it is considered that the frequency bandwidth of 1 GHz or higher will be necessary in the near future. Further, it is desired in the industry that a probe card is capable of handling a large number of semiconductor devices, especially memory devices, such as 32 or more, in a parallel fashion to increase test throughput.

The size of the contact target such as a semiconductor wafer is increasing to produce as many IC chips as possible by one production process. Typically, the silicon wafer of today is as large as twelve inches or more in diameter. To increase the test throughput, it is ideal to use a probe card having a size and number of contactors compatible with the semiconductor wafer under test so as to test the overall wafer by a single contact operation.

However, in the conventional technology, probe cards available in the market are substantially smaller than the size of the semiconductor wafer, requiring many steps of contact operations by shifting the semiconductor wafer relative to the probe card. Thus, there is a need of a contact structure with a new concept which can dramatically increase the frequency bandwidth as well as the size of contactor assembly and the number of contactors mounted on the contactor assembly.

SUMMARY OF THE INVENTION

Therefore, it is an object of the present invention to provide a contact structure having a large number of contactors for electrically communicating with contact targets with a high frequency bandwidth, high pin counts and high contact performance as well as high reliability.

It is another object of the present invention to provide a contact structure and its assembly mechanism for assembling a plurality of contact structures to form a contactor assembly of desired size with desired number of contactors mounted on the contactor assembly.

It is a further object of the present invention to provide a contact structure such as a probe card to establish electrical connection with leads or pads of semiconductor devices for testing the semiconductor devices with high frequency bandwidth.

In the present invention, a contact structure for establishing electrical connection with contact targets is formed of a large number of contactors produced on a planar surface of a silicon substrate by a semiconductor production process including photolithography technology. The contact structure of the present invention has a specific structure in the outer edges so as to fit with other contact structures, thereby forming a contactor assembly of desired sizes and number of contactors to test a large sized semiconductor device such as a semiconductor wafer. The contact structure can be advantageously used for testing (including burn-in) a semiconductor wafers, packaged LSIs or printed circuit boards, but also can be used in applications other than the testing, such as in forming any electrical connections between two or more components.

The contact structure of the present invention is a block of a large contact structure or a contactor assembly for establishing electrical connection with contact targets. The contact structure is formed of a contact substrate and a plurality of contactors in which each of the contactors has a curved portion for exerting spring force in a vertical direction. The contact substrate has engagement mechanism at outer edges thereof so as to connect other contact substrates at any desired edges to establish the contactor assembly with desired size, shape and number of contactors.

In one aspect, the contactor is comprised of a tip portion which is protruded in a vertical direction to form a contact point, a base portion which is inserted in a through hole provided on the contact substrate in such a way that an end of the contactor functions as a contact pad for electrical connection at a bottom surface of the contact substrate, and a spring portion having a curved or diagonal or other shape provided between the tip portion and the base portion which produces a spring force when the contactor is pressed against the contact target.

In another aspect, the contactor is comprised of a straight body having a tip portion which is sharpened to form a contact point, a base portion which is inserted in the through hole provided on the contact substrate, and a spring portion having a curved, diagonal, ring like or other shape provided on the base portion which produces a spring force when the contactor is pressed against the contact target. The spring portion and the base portion of the contactor are inserted in the through hole of the contact substrate so that at least the spring portion be projected from the bottom surface of the contact substrate to function as a contact point for electrical communication with an external component.

According to the present invention, the contact structure has a very high frequency bandwidth to meet the test requirements of the next generation semiconductor technology. Each contact structure or contact substrate has the engagement mechanism at the outer edges thereof for creating the contactor assembly of desired size and desired number of contactors. Further, because the contactors are assembled on the same substrate material as that of the device under test, it is possible to compensate positional errors caused by temperature changes. Further, it is possible to produce a large number of contactors in the horizontal direction on the silicon substrate by using relatively simple technique. Such contactors are removed from the substrate and mounted on the contact substrate to form the contact structure in the vertical direction. The contact structure of the present invention is advantageously applied in testing a semiconductor wafer, packaged LSI, multi-chip module and the like including burn-in testing, although it can be used in any applications involving electrical connection.

BRIEF DESCRIPTION OF THE DRAWINGS

FIG. 1 is a cross sectional view showing an example of total stack-up structure using the contact structure of the present invention as an interface between a semiconductor device under test and a test head of a semiconductor test system.

FIG. 2 is a cross sectional view showing another example of total stack-up structure using the contact structure of the present invention as an interface between a semiconductor device under test and a test head of a semiconductor test system.

FIGS. 7A–7C show the contact substrate of FIGS. 6A and 6B where FIG. 7A is a top view of the contact substrate, FIG. 7B is a cross sectional view of the contact substrate taken along the C—C line of FIG. 6B, and FIG. 7C is a cross sectional view of the contact substrate taken along the D—D line of FIG. 6B.

DETAILED DESCRIPTION OF THE PREFERRED EMBODIMENT

Figure 3A:
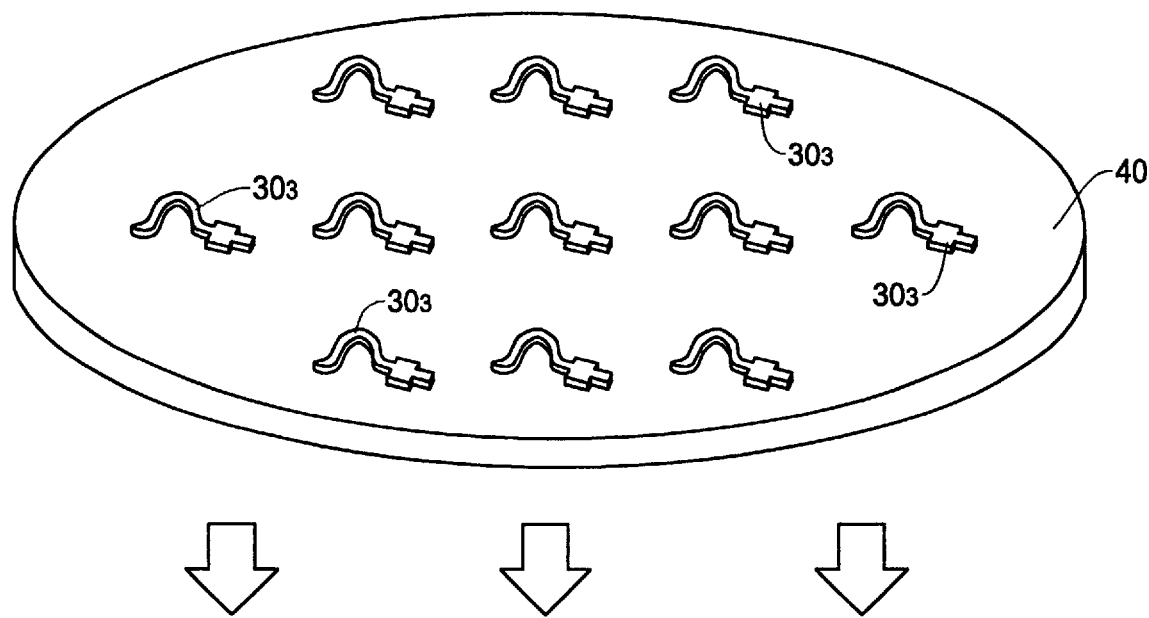
FIGS. 3A and 3B are schematic diagrams showing basic concepts of producing the contactors of the present invention in which a large number of contactors are formed on a planar surface of a silicon substrate and removed therefrom for later processes.

FIG. 1 is a cross sectional view showing an example of contactor assembly using the contact structure of the present invention. The contactor assembly is used as an interface between a device under test (DUT) and a test head of a semiconductor test system. The contactor assembly can take various other forms, and the example of FIG. 1 is shown only for an illustration purpose. In this example, the device under test is a semiconductor wafer 300 having contact pads 320 on the upper surface. It should be noted however that the application of the contact structure of the present invention is not limited to the semiconductor device testing. The present invention can be used in any situations where electrical connection has to be established.

In FIG. 1, the contactor assembly includes a conductive elastomer 250, a routing board (PCB card or probe card) 260, and a pogo-pin block (frog ring) 130 provided over contact structures $20_1$ and $20_2$. Under the contact structures $20_1$ and $20_2$, the semiconductor wafer 300 under test is positioned on a chuck of a semiconductor wafer prober (not shown). Typically, the pogo-pin block 130, the probe card (routing board) 260, the conductive elastomer 250 and the contact structures $20_1$ and $20_2$ are fixedly attached one another by fastening means such as screws (not shown). Thus, when the semiconductor wafer 300 moves upward and presses the contact structures, electrical communication is established between the semiconductor wafer 300 and a test head of the semiconductor test system (not shown).

The pogo-pin block (frog ring) 130 has a large number of pogo-pins to interface between the routing board (probe card) 260 and the test head through a performance board (not shown). At upper ends of the pogo-pins, cables 124 such as coaxial cables are connected to transmit signals to the test head. The probe card (routing board) 260 has a large number of electrodes 262 and 265 on the upper and lower surfaces thereof. The electrodes 262 and 265 are connected through interconnect traces 263 to fan-out the pitch of the contact structure to meet the pitch of the pogo-pins in the pogo-pin block 130.

The conductive elastomer 250 is provided between the contact structure and the probe card 260. The conductive elastomer 250 may not always be necessary in the contactor assembly but is preferable depending on the specific design and thus is illustrated in FIG. 1 as an example. The conductive elastomer 250 is to ensure electrical communications between the contact pads (contactor base ends) 35 of the contactors 30, and the electrodes 262 of the probe card 260 by compensating planarization or uneven gaps therebetween. Typically, the conductive elastomer 250 is an elastic sheet having a large number of conductive wires in a vertical direction.

For example, the conductive elastomer 250 is comprised of a silicon rubber sheet and a multiple rows of metal filaments 252. The metal filaments (wires) 252 are provided in the vertical direction of FIG. 1, i.e., perpendicular to the horizontal sheet of the conductive elastomer 250. An example of pitch between the metal filaments is 0.05 mm with thickness of the silicon rubber sheet is 0.2 mm. Such a conductive elastomer is produced by Shin-Etsu Polymer Co. Ltd, Japan, and available in the market.

The contact structure of the present invention can take various forms, an example of which is shown by the contact structure 20. In the example of FIG. 1, the contact structure 20 is configured by two contact structures $20_1$ and $20_2$ connected to each other. Each of the contact structures $20_1$ and $20_2$ includes a contact substrate 22 and a plurality of contactors $30_1$ mounted on the contact substrate 22. Typically, the contact substrate 22 is made of silicon wafer, however, other dielectric materials such as ceramic, glass, polyimide and the like are also feasible. Preferably, as will be described in more detail later, the contact substrate 22 is made of a plurality of semiconductor wafers such as three wafers bonded together.

In the example of FIG. 1, each contactor $30_1$ has a base portion 35 which is connected to the contact substrate 22 and a curved (spring) portion 36 extended from the base portion 35 in a vertical direction (downward direction of FIG. 1). A tip 38 of the curved portion 36 is a contact point which is preferably sharpened to achieve a scrubbing effect when pressed against the surface of the contact target. The curved portion 36 functions as a spring to exerts a contact force when the contact structure 20 is pressed against the contact pads 320 on the semiconductor wafer 300 to be tested. Various other forms are possible such as a zigzagged, diagonal or ring shape and the like to function as the spring noted above.

By the elasticity produced by the spring force, the curved portion 36 of the contactor $30_1$ functions to compensate differences in size or flatness (planarity) involved in the contact substrates 22, the contact targets (pads) 320 and the semiconductor wafer 300, as well as the contactors $30_1$. The spring force also creates the scrubbing effect noted above at the tip 38 of the contactor $30_1$ against the surface of contact pad 320. Such a scrubbing effect promotes an improved contact performance when the contact point scrubs the metal oxide surface of the contact pad 320 to electrically contact the conductive material of the contact pad 320.

FIG. 2 is a cross sectional view showing another example of contactor assembly using the contact structure of the present invention. The contactor assembly is used as an interface between the semiconductor wafer under test and the test head of the semiconductor test system, although present invention can be used in any situation where electrical connection has to be established. The basic difference in the example of FIG. 2 from that of FIG. 1 resides in the shape of the contactors mounted on the contact substrate and exclusion of the conductive elastomer.

In FIG. 2, the contactor assembly includes the probe card 260 and the pogo-pin block (frog ring) 130 provided over contact structures 20. Under the contact structures 20, the semiconductor wafer 300 under test is positioned by the semiconductor wafer prober (not shown). The contactor assembly of FIG. 2 has no conductive elastomer between the contact structure 20 and the probe card 260. The contact structure 20 is made of a plurality of contact substrates 22 each having a plurality of contactors $30_2$. The shape of the contactors $30_2$ is different from that of the contactors $30_1$ in FIG. 1.

In the example of FIG. 2, the contactor $30_2$ has a curved (spring) portion 36 on the base portion 35, i.e., an upper end of the contactor of FIG. 2, and a straight portion 37 having a contact point at its lower end. Typically, the pogo-pin block 130, the PCB card (routing board) 260, and the contact structures $20_1$ and $20_2$ are fixedly attached by fastening means such as screws (not shown). Thus, when the semiconductor wafer 300 moves upward and presses the contact structures 20, electrical communication is established between the semiconductor wafer 300 and the test head of the semiconductor test system (not shown).

A tip 38 of the straight portion 37 of the contactor $30_2$ is a contact point which is preferably sharpened to achieve a scrubbing effect when pressed against the surface of the contact target. The curved (spring) portion 36 on the upper surface of the base portion 35 functions as a spring to exerts a contact force when the contact structure 20 is pressed against the contact pads 320 on the semiconductor wafer 300 to be tested. Various other forms are possible such as a zigzagged or diagonal or ring shape and the like to function as the spring noted above.

By the elasticity produced by the spring force, the curved portion 36 of the contactor $30_2$ functions to compensate differences in size or flatness (planarity) involved in the contact substrate 22, the contact targets 320 and the semiconductor wafer 300, as well as the contactors $30_2$. The spring force also creates the scrubbing effect noted above at the tip of the contactor $30_2$ against the surface of contact pad 320. The scrubbing effect improves a contact performance when the contact point scrubs the metal oxide surface of the contact pad 320 to electrically contact the conductive material of the contact pad 320. Because of the spring actions of the curved portions 36 of the contactors $30_2$, the conductive elastomer 250 in FIG. 1 is not incorporated in the example of FIG. 2.

Figure 3B:
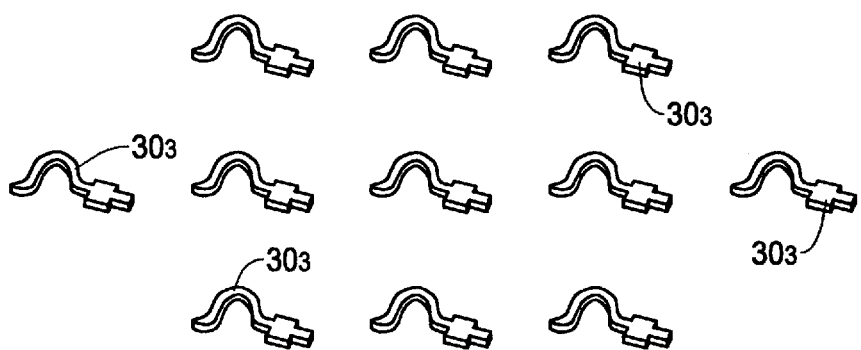

FIG. 3A and 3B show basic ideas of producing the contactors 30 to be mounted on the contact substrates 22. In this example, as shown in FIG. 3A, contactors $30_3$ are produced on a planar surface of a silicon substrate 40 or other dielectric substrate in a horizontal direction in parallel with the surface of the silicon substrate 40, i.e., in a two dimensional manner. Then, as shown in FIG. 3B, the contactors $30_3$ are removed from the silicon substrate 40 to be mounted on the contact substrates 20 of FIGS. 1 and 2 in a vertical direction or in perpendicular to the surface of the silicon substrate 40, i.e., in a three dimensional manner.

During this process, the contactors $30_3$ may be transferred from the silicon substrate 40 to an adhesive member, such as an adhesive tape, adhesive film or adhesive plate (collectively "adhesive tape") before being mounted on the contact substrates. The details of such a production process is described in the U.S. Pat. No. 5,989,994 and the U.S. patent application Nos. 09/201,299 and 09/503,903 owned by the same assignee of the present invention.

Figure 4:
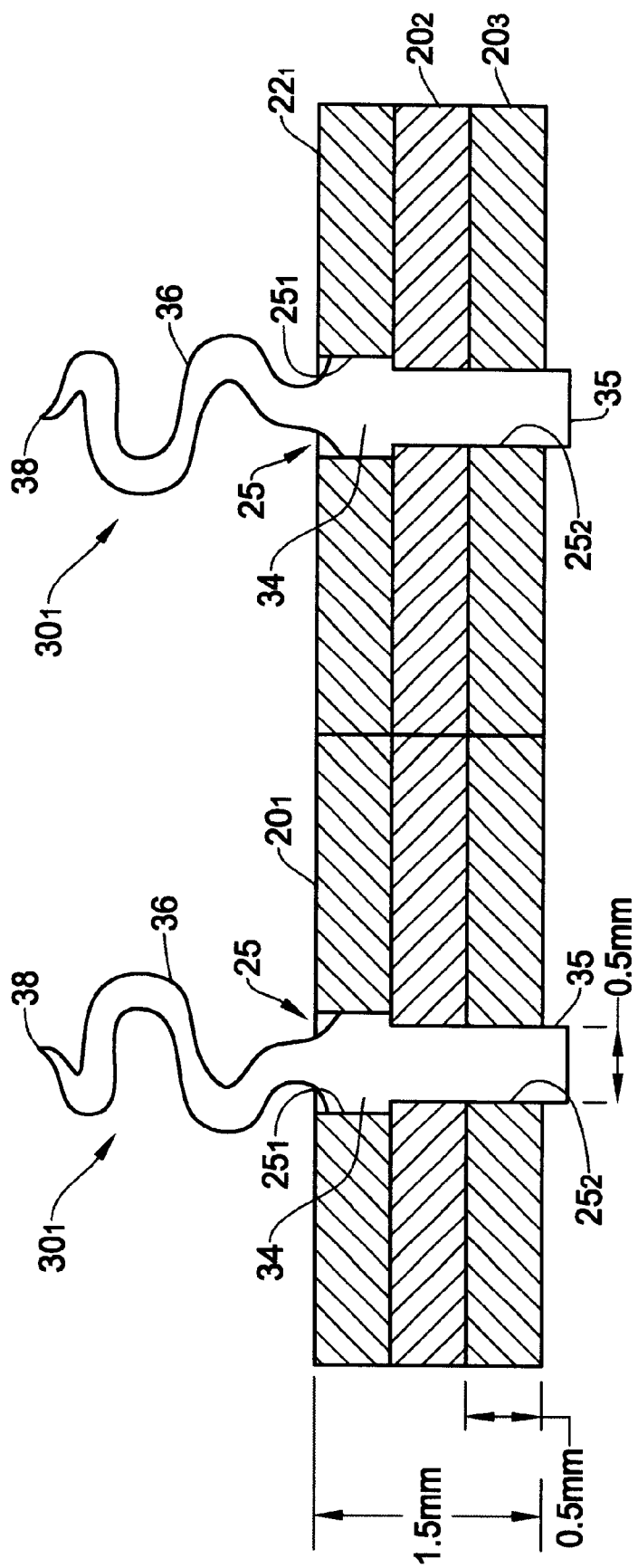
FIG. 4 is a schematic diagram showing an example of contact structure of the present invention having a multi-layered silicon substrate and the contactors produced through the production process of FIGS. 3A and 3B.

FIG. 4 is a cross sectional view showing an example of contact structure 20 of the present invention using the contactors $30_1$ produced through the process of FIGS. 3A and 3B. The contact structure 20 of FIG. 4 is the same as that shown in FIG. 1. The contact structure 20 is configured by combining two or more contact structures to enlarge the overall size thereof. In FIG. 4, two contact structures $20_1$ and $20_2$ are connected to each other, although many contact structures or contact substrates can be connected one another in a manner shown in FIG. 8.

Although only one of them is shown, a plurality of contactors $30_1$ are attached to the contact substrate 22 in a manner that an end of each contactor $30_1$ is inserted in a through hole 25 of the substrate 22. Typically, the contact substrate 22 is made of silicon wafer, however, other dielectric materials such as ceramic, glass, polyimide and the like are also feasible. In the preferred embodiment, the contact substrate 22 is a multi-layered substrate having multiple standard silicon wafers such as three wafers $22_1$, $22_2$ and $22_3$ which are stacked and bonded to one another. The major reason of using the multiple silicon wafers is to attain a sufficient thickness of the contact substrate without increasing tolerance in mechanical dimensions. Thus, the number of silicon wafers can be selected freely such as one or more depending on the specific requirements in the design. The standard silicon wafers have the same thickness but different outer shape to create engagement mechanism such as teeth and recesses as will be described later.

An example of thickness of each of the silicon wafers $22_1$–$22_3$ is about 0.5 mm. The base portion 35 of the contactor $30_1$ is projected from the bottom surface of the contact substrate 20 for forming a contact pad. As an example, the size of the contact pad, i.e., a bottom surface of the base portion 35 is 0.5 mm in width. The contactor $30_1$ has a flange like portion 34 to be fitted with a step formed in the through hole 25. As mentioned above, the contact point at the tip of the contactor $30_1$ is preferably sharpened to promote the scrubbing effect on the metal oxide surface of the contact target 320.

The process of forming the three layered contact substrate 22 and through holes 25 thereon shown in FIG. 4 is briefly explained in the following. First, the second silicon wafer $22_2$ and the third silicon wafer $22_3$ are directly bonded together through, for example, silicon fusion bonding or anodic bonding. The fusion bonding and anodic bonding are known in the art and described, for example, in "Fundamentals of Microfabrication", pages 383–390, Mark Madou, CRC Press. Then, the silicon wafers $22_2$ and $22_3$ are polished both front and back, and through holes $25_2$ are created therethrough by an etching process. Such a deep trench etching is achieved, for example, by reactive ion etching using a reactive gas plasma. As shown in FIG. 4, the size of the through holes $25_2$ on the second and third wafers $22_2$ and $22_3$ must be smaller than the flange like portion 34 of the contactor $30_1$ to form the steps in the through holes.

Then, the first silicon wafer $22_1$ is polished its front and back surfaces and through holes $25_1$ are created therethrough by the deep trench etching noted above. The size of the through holes $25_1$ of the first silicon wafer $22_1$ is larger than the through holes $25_2$ of the second and third silicon wafers $22_2$ and $22_3$ to receive the flange like portion 34 of the contactor $30_1$, as noted above. The first silicon wafer $22_1$ is aligned and fusion bonded to the second and third silicon wafers $22_2$ and $22_3$. For insulation, silicon oxide layers of, for example, at least one micrometer may be grown on all of the exposed surfaces of the contact substrate 22 produced in this manner. Then, the contactors $30_1$ are inserted in the through holes 25 and may be fixed therein by applying an adhesive if necessary.

Figure 5:
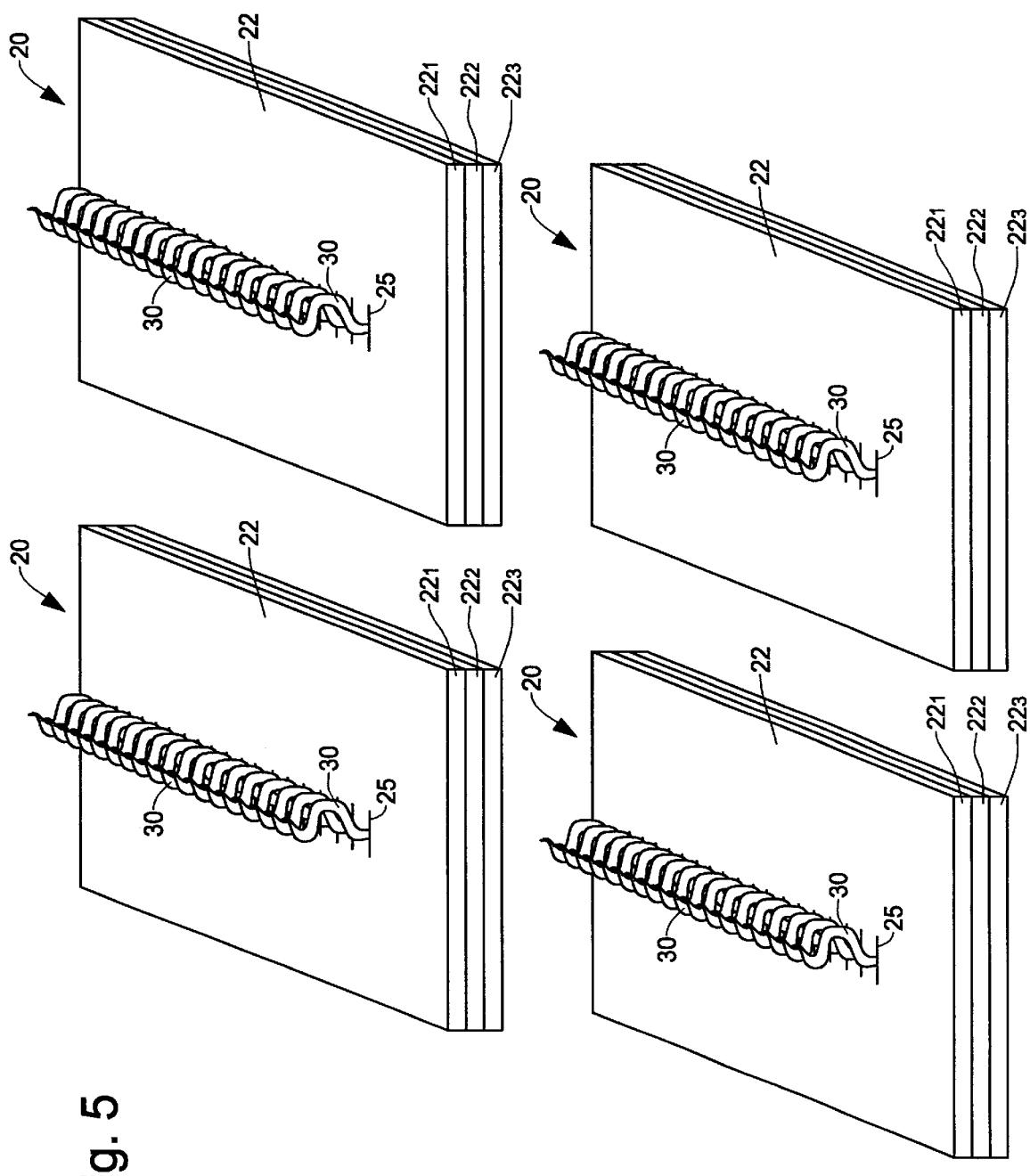
FIG. 5 is a perspective view showing a plurality of contact structures of the present invention each having a large number of contactors for assembling with one another to constitute a contactor assembly of desired size.

FIG. 5 is a perspective view showing an example of contact structures of the present invention each having a large number of contactors 30 produced through the process shown in FIGS. 3A and 3B. This example shows a plurality of contactors 30 assembled in a single line, however, a contact structure of the present invention may include contactors aligned in two or more lines, i.e, a matrix manner.

One of the features of the present invention is the capability of combining a plurality of contact structures 20 to create a contact structure (contactor assembly) of increased overall size and number of contactors. In the example of FIG. 5, four contact structures 20 are prepared to be connected to one another. Although not shown in the example of FIG. 5, each contact substrate 22 has connection mechanism such as teeth at the outer edges thereof, an example of which is shown in FIGS. 6A and 6B.

Figure 6A:
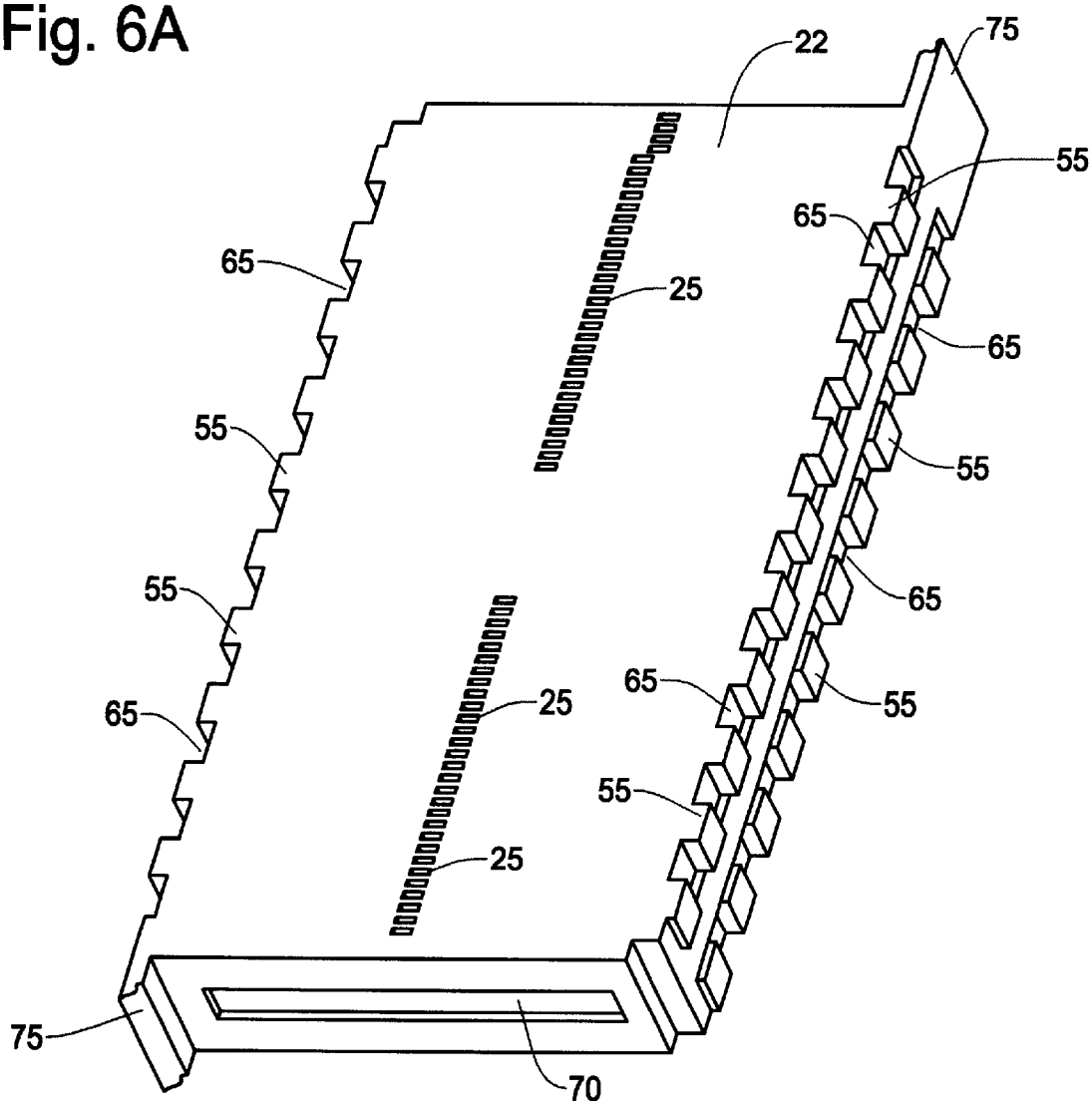
FIG. 6A is a perspective view showing a detailed structure of the contact substrate configured by three or more semiconductor wafers and having specific engagement structures at outer edges thereof to fit with outer edges of other contact substrates.
Figure 6B:
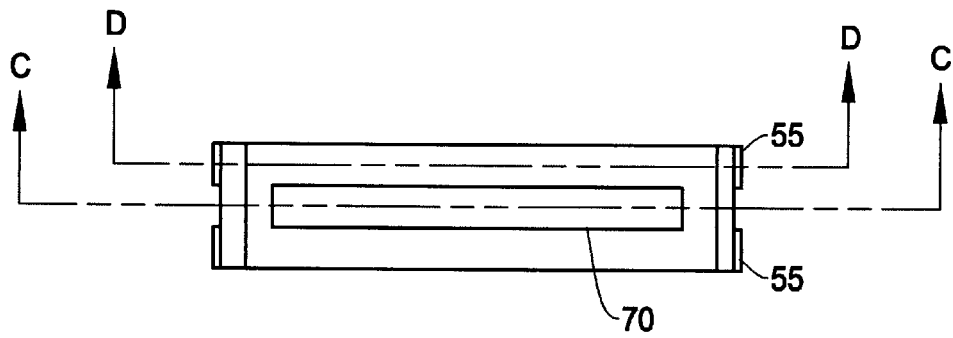
FIG. 6B is a front view of the contact substrate of FIG. 6A.

Therefore, FIG. 6A is a perspective view showing an example of detailed structure of the contact substrate 22 configured by three semiconductor wafers. FIG. 6B is a front view of the contact substrate of FIG. 6A. The contact substrate 22 has specific engagement structures at the outer edges thereof to fit with outer edges of other contact substrates. Such engagement structures or edge connectors are shown only illustration purposes and not limited to the example in FIGS. 6A and 6B. In this example, the right and left edges of the contact substrate are provided with engagement teeth 55 and recesses 65. The size of the tooth 55 and recess 65 is the same in the right and left edges, however, the position of the tooth 55 and recess 65 is shifted by one unit (FIG. 7C). Thus, the left edge of one contact substrate 22 fits with the right edge of another contact substrate 22.

The example of FIG. 6A further includes projections 75 at two corners of the substrate 22 and a groove 70 at one end of the substrate 22 which promote accurate positioning relative to the contact substrates 22 in the longitudinal direction thereof. The projections 75 may not be essential but are useful in aligning two or more contact substrates together. Although not shown in FIG. 6A, a projection 80 (FIGS. 7A and 7B) is provided at a distal end of the contact substrate 22 to fit in the groove 70 at a proximal end of another contact substrate 22. Instead of using the projections 80 and grooves 70, it is also possible to use the teeth and recesses such as in the right and left edges described above. The contactors 30 will be mounted on the contact substrate 22 in the manner shown in FIGS. 4 and 5 in the through holes 25.

As noted above, the example of FIGS. 6A and 6B is the multi-layered substrate made of, for example, three standard silicon substrates. Thus, the first (upper) substrate and the third (lower) substrate may be provided with the teeth 55 and recesses 65 at the right and left edges while the second (intermediate) substrate has no teeth or recesses but has the groove 70 and the counterpart projection 80. As noted above, the three silicon substrates are fusion bonded with one another. Further, when assembling the contact substrates to achieve a contactor assembly of desired size, the contact substrates 22 may be bonded together by adhesives if necessary.

FIGS. 7A–7C show the contact substrate 22 of FIGS. 6A and 6B where FIG. 7A is a top view of the contact substrate 22, FIG. 7B is a cross sectional view of the contact substrate 22 taken along the C—C line of FIG. 6B, and FIG. 7C is a cross sectional view of the contact substrate 22 taken along the D—D line of FIG. 6B. The top view of FIG. 7A basically shows the upper substrate with teeth 55 and recesses 65 and the intermediate substrate having the projection 80.

The cross sectional view of FIG. 7B shows the groove 70 and the projection 80 of the intermediate substrate and the teeth 55 and recesses 65 of the lower substrate. The cross sectional view of FIG. 7C shows the plan view of the upper substrate which has the same structure as that of the lower substrate. The through holes 25 are shown in each substrate of FIGS. 7A–7C to mount the contactors 30 thereon.

Figure 8:
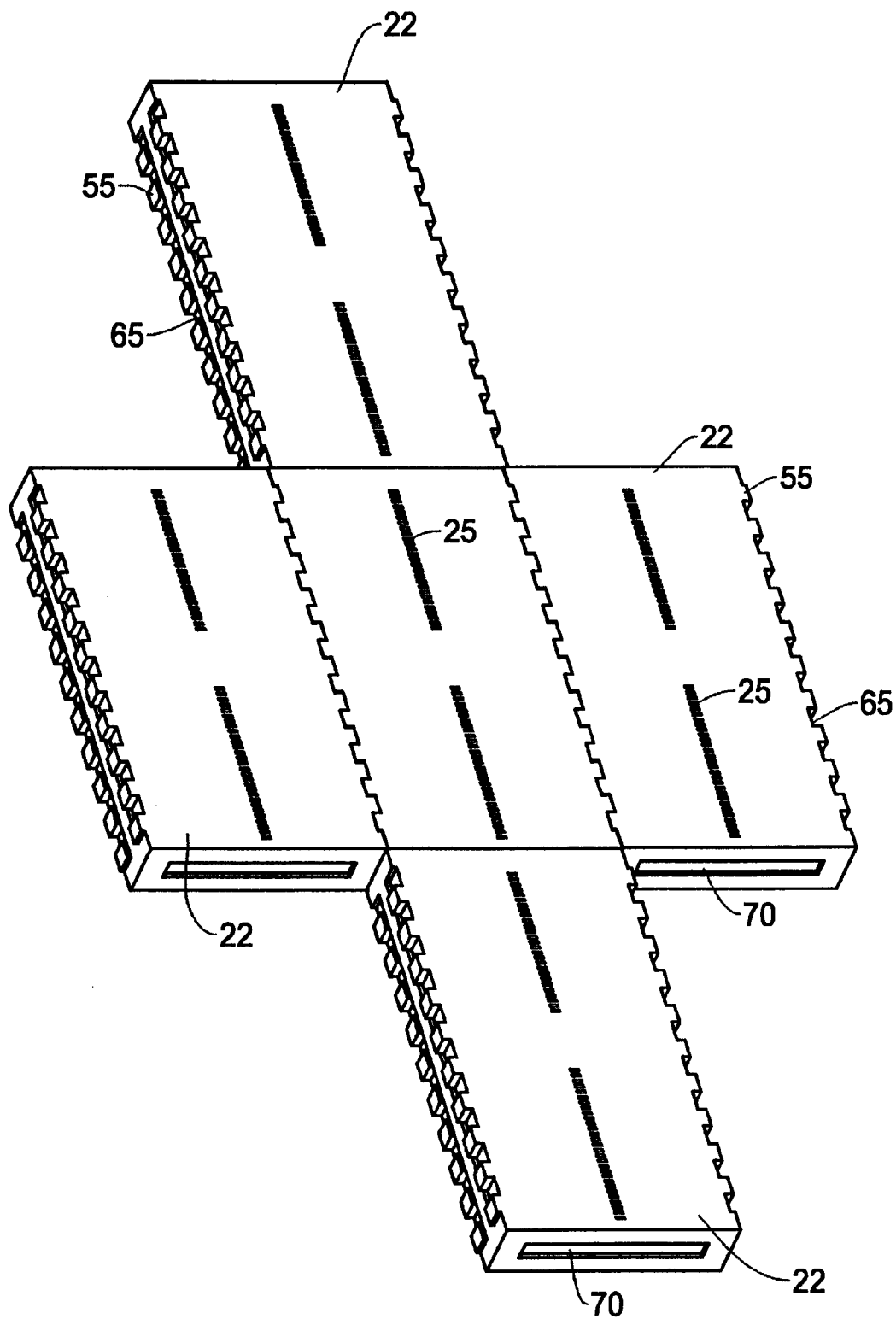
FIG. 8 is a perspective view of the contact structure of the present invention wherein five contact substrates are connected with one another to establish a contactor assembly with desired size, shape and number of contactors.

FIG. 8 is a perspective view of the contact structure, i.e., a contactor assembly formed by a plurality of contact structures of the present invention. In this example, five contact substrates 22 are connected with one another to create a contactor assembly having an overall size which is an integer multiple of the size of the contact structure. As shown in FIG. 8, the size of the contactor assembly is freely enlarged by side-by-side connecting the contact substrates 22 in two or four directions. For simplicity of illustration, the contactors are not shown on the contact substrates. By combining the contact substrates 22 in this manner, a contact assembly of desired size such as equivalent to the size of a twelve-inch semiconductor wafer can be established.

According to the present invention, the contact structure has a very high frequency bandwidth to meet the test requirements of the next generation semiconductor technology. Each contact structure or contact substrate has the engagement mechanism at the outer edges thereof for creating the contactor assembly of desired size and desired number of contactors. Further, because the contactors are assembled on the same substrate material as that of the device under test, it is possible to compensate positional errors caused by temperature changes. Further, it is possible to produce a large number of contactors in the horizontal direction on the silicon substrate by using relatively simple technique. Such contactors are removed from the substrate and mounted on the contact substrate to form the contact structure in the vertical direction. The contact structure of the present invention is advantageously applied in testing a semiconductor wafer, packaged LSI, multi-chip module and the like including burn-in testing, although it can be used in any applications involving electrical connection.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing electrical connection with contact targets, comprising:

one piece contact substrate integrally formed with dielectric material and having through holes between upper and lower surfaces thereof and engagement mechanism at outer edges thereof for connecting other contact substrates side-by-side at any desired edges to create a contactor assembly of arbitrary size by expanding the size in four directions; and a plurality of contactors mounted on the contact substrate where each of the contactors is comprised of a tip portion which is protruded in a direction perpendicular to the surface of the contact substrate to form a contact point to contact the contact target, a base portion which is inserted in the through hole provided on the contact substrate, and a spring portion provided between the tip portion and the base portion which produces a spring force when the contactor is pressed against the contact target;

wherein the base portion inserted in the through hole of the contact substrate is projected from the upper surface of the contact substrate to function as a contact pad for electrical communication with an electrode on a probe card, and the spring portion of the contactor is provided below the lower surface of the contact substrate.

2. A contact structure for establishing electrical connection with contact targets as defined in claim 1, wherein the engagement mechanism is a combination of teeth and recesses provided at outer edges of the contact substrate in such a way that the engagement mechanism formed with the teeth and recesses at one edge fits with the engagement mechanism formed with the teeth and recesses at an opposite edge of other contact substrate, thereby assembling a plurality of contact substrates to establish the contactor assembly of desired size, shape and number of contactors.

3. A contact structure for establishing electrical connection with contact targets as defined in claim 1, wherein the engagement mechanism is a combination of teeth and recesses provided at right and left edges of the contact substrate in such a way that the engagement mechanism formed with the teeth and recesses in the right edge fits with the engagement mechanism formed with the teeth and recesses in the left edge of other contact substrate, and wherein the contact substrate includes a projection at a front or back edge thereof and a groove at the back or front edge in such a way that the projection of one contact substrate fits in the groove of another contact substrate, thereby assembling a plurality of contact substrates to establish the contactor assembly of desired size, shape and number of contactors.

4. A contact structure for establishing electrical connection with contact targets as defined in claim 1, wherein the contact substrate is integrally formed of a single silicon wafer or a plurality of silicon wafers bonded to one another and the through holes on the contact substrate are created through an etching process.

5. A contact structure for establishing electrical connection with contact targets as defined in claim 1, wherein the contact substrate is made of silicon.

6. A contact structure for establishing electrical connection with contact targets as defined in claim 1, wherein the contact substrate is made of dielectric material including polyimide, ceramic and glass.

7. A contact structure for establishing electrical connection with contact targets as defined in claim 1, wherein the contact substrate is integrally formed of a single silicon wafer on which through holes are produced for mounting the contactors therethrough.

8. A contact structure for establishing electrical connection with contact targets as defined in claim 1, wherein the contact substrate is integrally formed of first and second silicon wafers which are bonded together on which through holes are produced for mounting the contactors therethrough.

9. A contact structure for establishing electrical connection with contact targets as defined in claim 1, wherein each of the contactors is provided with a flange like portion at the bottom portion thereof to be fitted in the through hole on the contact substrate.

10. A contact structure for establishing electrical connection with contact targets as defined in claim 1, wherein the contactors are produced on a planar surface of a flat substrate in a direction parallel with the flat substrate and removed from the flat substrate and mounted on the contact substrate in a direction perpendicular to a surface of the contact substrate.

11. A contact structure for establishing electrical connection with contact targets as defined in claim 1, wherein the contact targets are provided on devices including semiconductor chips on a wafer, packaged semiconductor devices, printed circuit boards, liquid crystal panels, and microsockets, and the contact structure establishes electrical connection with the contact targets for testing or burn-in testing the devices.

12. A contact structure for establishing electrical connection with contact targets as defined in claim 1, wherein the contact substrate is integrally formed of three layers of silicon wafers which are bonded together on which through holes are produced for mounting the contactors therethrough.

13. A contact structure for establishing electrical connection with contact targets as defined in claim 12, wherein the three layers of the silicon wafers are formed of first, second and third silicon wafers, wherein the second and third silicon wafers are bonded together and a second through hole is created therethrough by an etching process, and a first through hole which is larger than the second through hole is produced on the first silicon wafer, and wherein the first silicon wafer is aligned to match positions of the first and second through holes and bonded to the second silicon wafer.

14. A contact structure for establishing electrical connection with contact targets, comprising:

one piece contact substrate integrally formed with dielectric material and having through holes between upper and lower surfaces thereof and engagement mechanism at outer edges thereof for connecting other contact substrates side by side at any desired edges to create a contactor assembly of arbitrary size by expanding the size in four directions; and a plurality of contactors mounted on the contact substrate where each of the contactors is comprised of a straight body having a tip portion which functions as a contact point to contact the contact target, a base portion at an end of the straight body opposite to the tip portion, and a spring portion provided on the base portion which produces a spring force when the contactor is pressed against the contact target;

wherein the straight body of the contactor is inserted in the through hole of the contact substrate in such a way that at least the contact portion is projected from the lower surface of the contact substrate to contact with the contact target, and the spring portion of the contactor is provided above the upper surface of the contact substrate for electrical communication with an electrode on a probe card.

15. A contact structure for establishing electrical connection with contact targets as defined in claim 14, wherein the engagement mechanism is a combination of teeth and recesses provided at outer edges of the contact substrate in such a way that the engagement mechanism formed with the teeth and recesses at one edge fit with the engagement mechanism formed with the teeth and recesses at an opposite edge of other contact substrate, thereby assembling a plurality of contact substrates to establish the contactor assembly of desired size, shape and number of contactors.

16. A contact structure for establishing electrical connection with contact targets as defined in claim 14, wherein the engagement mechanism is a combination of teeth and recesses provided at right and left edges of the contact substrate in such a way that the engagement mechanism formed with the teeth and recesses in the right edge fits with the engagement mechanism formed with the teeth and recesses in the left edge of other contact substrate, and wherein the contact substrate includes a projection at a front or back edge thereof and a groove at the back or front edge in such a way that the projection of one contact substrate fits in the groove of another contact substrate, thereby assembling a plurality of contact substrates to establish the contactor assembly of desired size, shape and number of contactors.

17. A contact structure for establishing electrical connection with contact targets as defined in claim 14, wherein the contact substrate is integrally formed of a single silicon wafer or a plurality of silicon wafers bonded to one another and the through holes on the contact substrate are created through an etching process.

18. A contact structure for establishing electrical connection with contact targets as defined in claim 14, wherein the contact substrate is made of silicon.

19. A contact structure for establishing electrical connection with contact targets as defined in claim 14, wherein the contact substrate is made of dielectric material including polyimide, ceramic and glass.

20. A contact structure for establishing electrical connection with contact targets as defined in claim 14, wherein the contact substrate is integrally formed of a single silicon wafer on which through holes are produced for mounting the contactors therethrough.

21. A contact structure for establishing electrical connection with contact targets as defined in claim 14, wherein the contact substrate is integrally formed of first and second silicon wafers which are bonded together on which through holes are produced for mounting the contactors therethrough.

22. A contact structure for establishing electrical connection with contact targets as defined in claim 14, wherein each of the contactors is provided with a flange like portion at the bottom portion thereof to be fitted in the through hole on the contact substrate.

23. A contact structure for establishing electrical connection with contact targets as defined in claim 14, wherein the contactors are produced on a planar surface of a flat substrate in a direction parallel with the flat substrate and removed from the flat substrate and mounted on the contact substrate in a direction perpendicular to a surface of the contact substrate.

24. A contact structure for establishing electrical connection with contact targets as defined in claim 14, wherein the contact targets are provided on devices including semiconductor chips on a wafer, packaged semiconductor devices, printed circuit boards, liquid crystal panels and microsockets, and the contact structure establishes electrical connection with the contact targets for testing or burn-in testing the devices.

25. A contact structure for establishing electrical connection with contact targets as defined in claim 14, wherein the contact substrate is integrally formed of three layers of silicon wafers which are bonded together on which through holes are produced for mounting the contactors therethrough.

26. A contact structure for establishing electrical connection with contact targets as defined in claim 25, wherein the three layers of silicon wafers are formed of first, second and third silicon wafers, wherein the second and third silicon wafers are bonded together and a second through hole is created therethrough by an etching process, and a first through hole which is larger than the second through hole is produced on the first silicon wafer, and wherein the first silicon wafer is aligned to match positions of the first and second through holes and bonded to the second silicon wafer.

\* \* \* \* \*